(12) United States Patent
Arai et al.

(10) Patent No.: US 7,239,021 B2
(45) Date of Patent: *Jul. 3, 2007

(54) STACKED CHIP SEMICONDUCTOR DEVICE AND METHOD FOR MANUFACTURING THE SAME

(75) Inventors: Yoshiyuki Arai, Nagaokakyo (JP); Takashi Yui, Otsu (JP); Fumito Itou, Ibaraki (JP); Yasutake Yaguchi, Takatsuki (JP); Toshitaka Akahoshi, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 204 days.

This patent is subject to a terminal disclaimer.

(21) Appl. No.: 10/881,044

(22) Filed: Jun. 30, 2004

(65) Prior Publication Data

US 2005/0003580 A1    Jan. 6, 2005

(30) Foreign Application Priority Data

Jul. 4, 2003    (JP) .............................. 2003-192139

(51) Int. Cl.
 *H01L 23/48*   (2006.01)
(52) U.S. Cl. ...................... 257/777; 257/783; 438/107; 438/118
(58) Field of Classification Search ................ 257/777, 257/778, 783, 724, E21.503, E21.511; 438/109, 438/112, 118, 108, 119, 124, 51, 612, 107, 438/126, 127
See application file for complete search history.

(56) References Cited

U.S. PATENT DOCUMENTS

| | | | |
|---|---|---|---|
| 6,100,594 A | 8/2000 | Fukui et al. ................. 257/777 |
| 6,118,184 A * | 9/2000 | Ishio et al. .................. 257/787 |
| 6,353,263 B1 * | 3/2002 | Dotta et al. .................. 257/777 |
| 6,391,682 B1 * | 5/2002 | Tsai et al. .................... 438/108 |
| 6,414,384 B1 * | 7/2002 | Lo et al. ...................... 257/685 |
| 6,448,659 B1 * | 9/2002 | Lee ............................. 257/777 |
| 6,514,794 B2 * | 2/2003 | Haba et al. .................. 438/109 |
| 6,552,437 B1 * | 4/2003 | Masuda et al. ............. 257/777 |
| 6,787,901 B2 * | 9/2004 | Reyes et al. ................. 257/724 |

(Continued)

FOREIGN PATENT DOCUMENTS

JP    11-204720    7/1999

*Primary Examiner*—Matthew Smith
*Assistant Examiner*—Khiem Nguyen
(74) *Attorney, Agent, or Firm*—Hamre, Schumann, Mueller & Larson, P.C.

(57) ABSTRACT

A stacked chip semiconductor device including: a substrate having electrode pads; a first semiconductor chip that is flip-chip-packaged on the substrate via a first adhesive layer; a second semiconductor chip that is mounted on an upper part of the first semiconductor chip and that has electrode pads; wires for electrically connecting the electrode pads of the second semiconductor chip and the electrode pads of the substrate; and a molded resin for encapsulating the first semiconductor chip, the second semiconductor chip and the wires, the first adhesive layer forming a fillet at the periphery of the first semiconductor chip. The first semiconductor chip is disposed with its central axis being offset from a central axis of the substrate, the offset being provided so that the first semiconductor chip is shifted toward a side opposite to a side where the fillet has a maximum length from the periphery of the first semiconductor chip. Thereby, influences of the fillet made of the adhesive are suppressed, allowing miniaturization of the device and improvement in the mass-productivity.

2 Claims, 4 Drawing Sheets

U.S. PATENT DOCUMENTS

| | | | |
|---|---|---|---|
| 6,873,034 B2* | 3/2005 | Nakamura et al. | 257/680 |
| 6,930,378 B1* | 8/2005 | St. Amand et al. | 257/686 |
| 6,992,396 B2* | 1/2006 | Arai et al. | 257/777 |
| 7,015,586 B2* | 3/2006 | Chien | 257/777 |
| 2002/0004258 A1* | 1/2002 | Nakayama et al. | 438/107 |
| 2002/0195697 A1* | 12/2002 | Mess et al. | 257/686 |
| 2003/0102567 A1* | 6/2003 | Eskildsen | 257/777 |
| 2003/0137042 A1* | 7/2003 | Mess et al. | 257/686 |

\* cited by examiner

STACKED CHIP SEMICONDUCTOR DEVICE AND METHOD FOR MANUFACTURING THE SAME

FIELD OF THE INVENTION

The present invention relates to a semiconductor device configured by stacking a plurality of semiconductor chips, and a method for manufacturing the same.

BACKGROUND OF THE INVENTION

A stacked chip semiconductor device known as a conventional semiconductor device is manufactured by stacking a plurality of semiconductor chips to be mounted on a substrate in order to improve the packaging density of the semiconductor chips and further encapsulating them with a molded resin. This type of semiconductor device is named also as a stacked package (see, for example, JP H11 (1999)-204720 A, page 7 and FIG. 3 thereof).

Figure 5A:
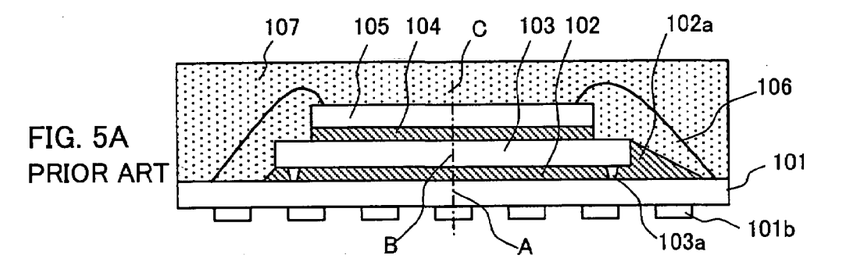
FIG. 5A is a cross-sectional view to show a conventional stacked chip semiconductor device.
Figure 5B:
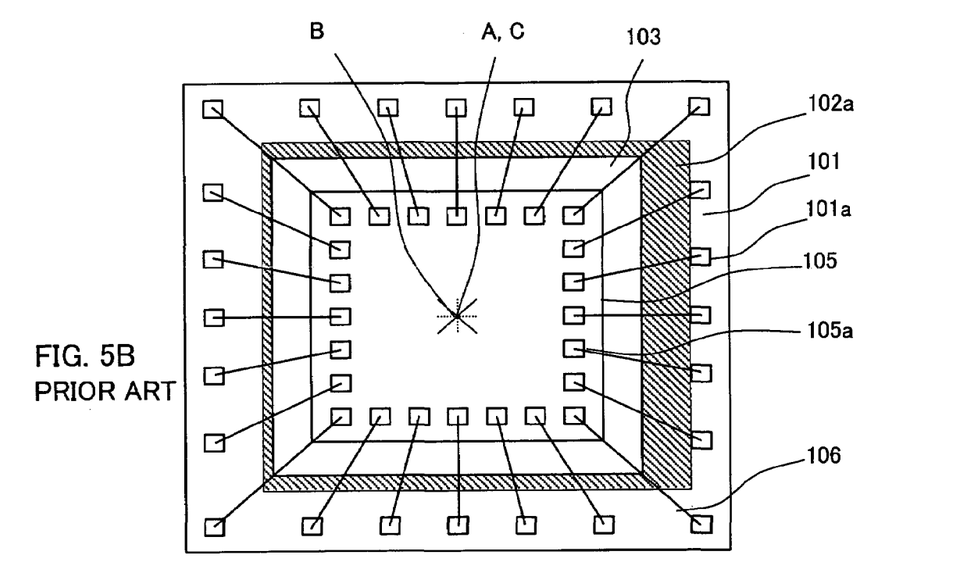
FIG. 5B is a plan view of the same semiconductor device.

FIGS. 5A and 5B show a conventional stacked chip semiconductor device. FIG. 5A is a cross-sectional view and FIG. 5B is a perspective plan view of the same semiconductor device.

In this stacked chip semiconductor device, a first semiconductor chip 103 is mounted on a substrate 101 via a first adhesive layer 102 by a so-called flip-chip-packaging. The substrate 101 has electrode pads 101a on its upper face and a land 101b on its bottom face. The first semiconductor chip 103 having bumps 103a is mounted with the bumps 103a facing downward.

On an upper part of the first semiconductor chip 103, a second semiconductor chip 105 having electrode pads 105a is mounted via a second adhesive layer 104. The electrode pads 105a of the second semiconductor chip 105 and the electrode pads 101a of the substrate 101 are electrically connected to each other via wires 106. The first semiconductor chip 103, the second semiconductor chip 105 and the wires 106 are encapsulated with a molded resin 107.

Here, a central axis A as a point of symmetry for the planar shape of the substrate 101, a central axis B of the first semiconductor chip 103, and a central axis C of the second semiconductor chip 105 are disposed to coincide with each other.

The first adhesive layer 102 is a cured liquid adhesive. After mounting the first semiconductor chip 103 on the substrate 101, the adhesive is charged into an entire region of a gap between the first semiconductor chip 103 and the substrate 101, excepting the bumps 103a, and cured in the gap. Thereby, the first semiconductor chip 103 is fixed firmly to the substrate 101 so that stress to be applied to the bumps 103a will be distributed to the entire region of the substrate 101 for mounting the chip, and the reliability of the semiconductor device is improved.

In the conventional stacked chip semiconductor device, as shown in FIGS. 5A and 5B, the first adhesive layer 102 spreading out of the periphery of the first semiconductor chip 103 forms a fringe 102a (hereinafter, referred to as 'fillet'). To accommodate formation of the fillet 102a, the substrate 101 must be enlarged by the area of the fillet 102a. This has been a barrier for the miniaturization of the semiconductor device.

This problem will be described further below. As mentioned above, the first adhesive layer 102 is formed by curing a liquid adhesive, and the surface is shaped with a certain curvature due to the surface tension of the adhesive. Especially, since the adhesive forms a pool at the side among the four sides of the periphery of the first semiconductor chip 103 from which the adhesive is injected, the fillet 102a will have a large volume and occupy more surface area of the substrate 101. The electrode pads 101a for electrically connecting the second semiconductor chip 105 and the substrate 101 are arranged around the region of the substrate 101 on which the fillet 102a is to be formed. When the adhesive composing the fillet 102a adheres to the electrode pads 101a, a connection failure of the wires 106 may occur and degrade the reliability of the semiconductor device. Therefore, the electrode pads 101a must be disposed keeping a predetermined distance from the end of the region on which the fillet 102 is formed, and this has been a barrier in reducing the area of the substrate 101.

The fillet 102a will be smaller at the three sides of the periphery of the first semiconductor chip 103 other than the side for adhesive injection. For this reason, it is possible to design the substrate 101 so that the electrode pads 101a at the three sides irrelevant to injection of the adhesive are disposed closer to the first semiconductor chip 103 while the electrode pads 101a are distant from the first semiconductor chip 103 at the side for adhesive injection. In such a case, however, the wires 106 at the side for adhesive injection become longer than the wires 106 at any of the three remaining sides. When the length of the wires at the four sides is not uniform, facility conditions for deciding the loop shapes of the wires should be modified for every side, and this may increase of the working times and decrease the yield.

The fillet 102a may be formed to spread over the first semiconductor chip 103. When this reaches the region for forming the second adhesive layer 104, the second semiconductor chip 105 cannot be fixed firmly to the first semiconductor chip 103, thereby reducing the reliability of the stacked chip semiconductor device. The fillet 102a tends to spread over the semiconductor chip 103 particularly at the side for adhesive injection. And the adhesion failure of the second semiconductor chip 105 to the upper part of the first semiconductor chip 103 will occur easily when the distance from the side for adhesive injection to the periphery of the second semiconductor chip 105 is short.

SUMMARY OF THE INVENTION

Therefore, with the foregoing in mind, it is an object of the present invention to suppress the influence of a fillet made of an adhesive and to provide a stacked chip semiconductor device that is small, excellent in reliability and appropriate for mass-production. Another object of the present invention is to provide a method for manufacturing the stacked chip semiconductor device.

A stacked chip semiconductor device of the present invention includes a substrate having electrode pads, a first semiconductor chip that is flip-chip-packaged on the substrate via a first adhesive layer, a second semiconductor chip that is mounted on an upper part of the first semiconductor chip via a second adhesive layer and that has electrode pads, wires for electrically connecting the electrode pads of the second semiconductor chip and the electrode pads of the substrate, and a molded resin for encapsulating the first and second semiconductor chips and the wires, the first adhesive layer forming a fillet at the periphery of the first semiconductor chip.

For achieving the object, the first semiconductor chip is disposed with its central axis being offset from a central axis of the substrate, the offset being provided so that the first semiconductor chip is shifted toward a side opposite to a side where the fillet has a maximum length from the periphery of the first semiconductor chip.

A method for manufacturing the stacked chip semiconductor device according to the present invention includes: flip-chip mounting a first semiconductor chip to a substrate having electrode pads; injecting an adhesive into a gap between the substrate and the first semiconductor chip so as to form a first adhesive layer of the adhesive with a fringe protruding out from the edge of the first semiconductor chip so as to form a fillet; bonding a second semiconductor chip on an upper part of the first semiconductor chip via a second adhesive layer; connecting the electrode pads of the second semiconductor chip and the electrode pads of the substrate by wires; and encapsulating the first semiconductor chip, the second semiconductor chip and the wires with a molded resin. In the step of flip-chip mounting, the first semiconductor chip is disposed with its central axis being offset from a central axis of the substrate, the offset being provided so that the first semiconductor chip is shifted toward a side opposite to a side from which the adhesive is injected in the underfilling step.

DETAILED DESCRIPTION OF THE INVENTION

In a stacked chip semiconductor device of the present invention, a first semiconductor chip to be flip-chip-packaged onto a substrate is disposed being offset from the center of the substrate, toward a side opposite to a side where a first adhesive layer forms the largest fillet, thereby enabling reduction of the substrate area. This enables a stacked chip semiconductor device to be smaller than a conventional stacked chip semiconductor device.

It is preferable that a second semiconductor chip to be mounted on an upper face of the first semiconductor chip is disposed so that the central axis of the second semiconductor chip coincides substantially with a central axis of the substrate. Thereby, the length of wires for electrically connecting the second semiconductor chip and the substrate can be made uniform over the entire periphery of the second semiconductor chip. This allows a shorter time for the wire-bonding step and improved quality, thereby improving the mass-productivity.

According to the method for manufacturing the stacked chip semiconductor device of the present invention, the first semiconductor chip is mounted on the substrate while being offset from the center of the substrate toward a side where the first adhesive layer forms a smaller fillet. The substrate area can be decreased in comparison with a conventional technique, thereby providing a smaller stacked chip semiconductor device.

It is preferable in the manufacturing method that the second semiconductor chip is mounted at a substantial center of the substrate. Thereby, the wires for electrically connecting the second semiconductor chip and the substrate can have a substantially equal length at the four sides of the second semiconductor chip, resulting in shortening of the working time and improvement of the quality, which will contribute to mass-production.

It is also preferable that the step of stack-die-bonding is carried out before the injection of the adhesive. It can suppress a defect such that the fillet formed in the underfilling step is spread onto the upper face of the first semiconductor chip and inhibits adhesion of the second adhesive layer to the upper face of the first semiconductor chip. This improves the reliability of the stacked chip semiconductor device.

In the step of bonding the second semiconductor chip, it is preferable that the second semiconductor chip is mounted to be flush with the side of the first semiconductor chip from which the adhesive is injected. As a result, at a time of injecting the adhesive from a side of the periphery of the first semiconductor chip in the underfilling step, at a pool of the adhesive formed in the vicinity of the adhesive injection side of the first semiconductor chip, the excess adhesive can be accumulated by the thickness of the second adhesive layer and of the second semiconductor chip in addition to the thickness of the first semiconductor chip. This configuration serves to prevent the adhesive from spreading onto the upper face of the first semiconductor chip, and thus improves the reliability of the semiconductor device.

Embodiments of the present invention will be described more specifically below with reference to the accompanying drawings.

(First Embodiment)

Figure 1A:
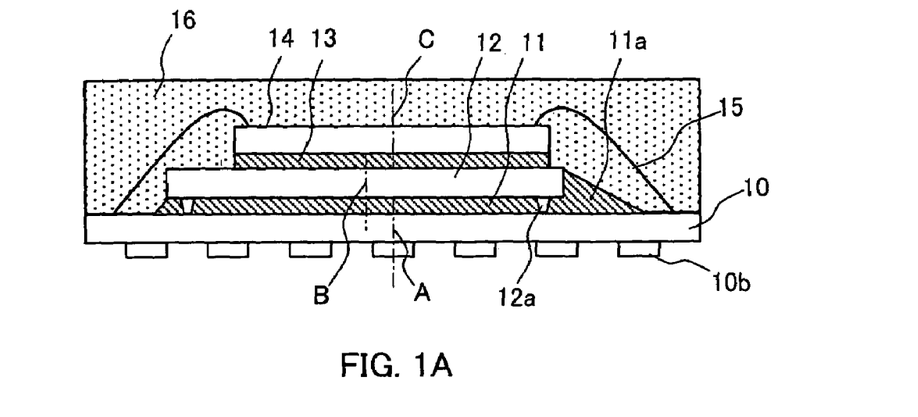
FIG. 1A is a cross-sectional view to show a stacked chip semiconductor device according to a first embodiment of the present invention.
Figure 1B:
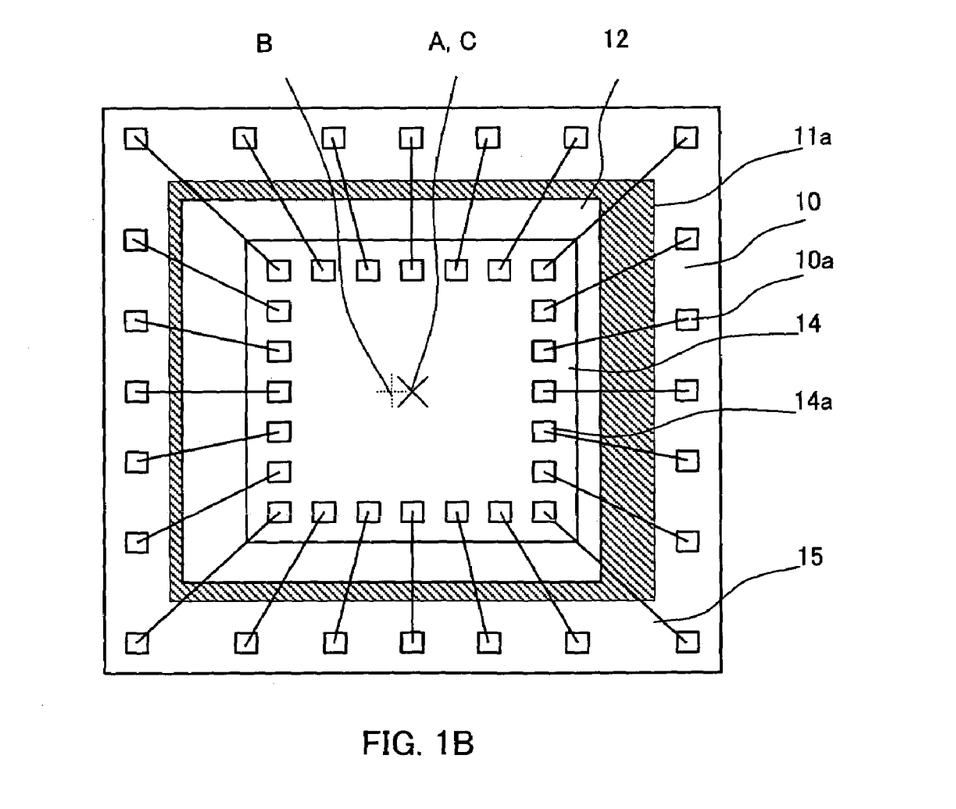
FIG. 1B is a plan view of the same semiconductor device.

FIGS. 1A and 1B show a stacked chip semiconductor device according to a first embodiment of the present invention. FIG. 1A is a cross-sectional view and FIG. 1B is a plan view.

In this stacked chip semiconductor device, a first semiconductor chip 12 is flip-chip-packaged on a substrate 10 via a first adhesive layer 11. The substrate 10 is a square having electrode pads 10a on its upper face and a land 10b on its bottom face. The first semiconductor chip 12 has bumps 12a and is mounted with the bumps 12a facing downward. Here, the sign A denotes a central axis of the substrate 10 as a point of symmetry for the plane, and B denotes a central axis of the first semiconductor chip 12. The central axis B is offset (displaced) from the central axis A. Directions of the offset will be described later below.

On the upper face of the first semiconductor chip 12, a square second semiconductor chip 14 having electrode pads 14a at the periphery of its upper face is mounted via a second adhesive layer 13. Here, C denotes a central axis of the second semiconductor chip 14, and the second semiconductor chip 14 is disposed so that the central axis C coincides with the central axis A. The electrode pads 14a of the second semiconductor chip 14 and the electrode pads 10a of the substrate 10 are connected electrically with wires 15. Furthermore, the first semiconductor chip 12, the second semiconductor chip 14 and the wires 15 are encapsulated with a molded resin 16.

The substrate 10 is a sheet-like insulator containing a conductor layer for electrically connecting the electrode pads 10a and the land 10b. Thereby, the substrate 10 serves to intermediate the electric connection of a mother substrate (not shown) on which this semiconductor device will be mounted, with the first semiconductor chip 12 and the second semiconductor chip 14. The insulator of the is substrate 10 typically is made of an inorganic substance such as a ceramic such as alumina, and an organic substance such as epoxy, BT resin and polyimide. The conductor is made of Cu or W The land 10b used for packaging to the mother substrate is arranged like a lattice, and this is referred to as LGA (Land Grid Array). Another example of the configurations is BGA (Ball Grid Array), in which a metal ball is mounted in place of the land 10b.

The first adhesive layer 11 fixes the first semiconductor chip 12 firmly to the substrate 10, and serves to secure reliability of the flip-chip connection between the substrate 10 and the bumps 12a. Usually, the adhesive composing the first adhesive layer 11 may be a liquid thermosetting resin based on epoxy resin or the like to which an additive such as a curing agent, a filler, a diluent and a coupling agent is added in accordance with the desired characteristics. The method for forming the first adhesive layer 11 includes, for example, dropping a liquid adhesive on the periphery of the first semiconductor chip 12 mounted on the substrate 10. As a result, the liquid adhesive is charged into the gap between the substrate 10 and the first semiconductor chip 12 by a capillary phenomenon, and subsequently cured by heat applied in a curing furnace so as to form the first adhesive layer 11. Since the liquid adhesive is charged into the gap under the first semiconductor chip 12 as mentioned above, this process can be also referred to as underfilling.

The second adhesive layer 13 serves to fix the second semiconductor chip 14 to the first semiconductor chip 12. Similar to the first adhesive layer 11, usually, the second adhesive layer 13 can be made of a thermosetting resin based on an epoxy resin or the like. The adhesive layer in an uncured state can be a liquid or a film, and it can be selected depending on the desired characteristics and processes. An example for the typical process using a film adhesive includes sticking the adhesive onto a back face of the second semiconductor chip 14 when the second semiconductor chip 14 is in a wafer state; cutting out the film-like adhesive in the same size as the second semiconductor chip 14 when dividing the second semiconductor chips 14; and thermo-compressing the adhesive onto the upper face of the first semiconductor chip 12.

In general, a Si wafer is used for the first semiconductor chip 12 and the second semiconductor chip 14. Alternatively, a wafer of a compound semiconductor such as SiGe, GaAs, or GaP can be used as well. The first semiconductor chip 12 and the second semiconductor chip 14 can be made of an identical material or separate materials.

The bumps 12a are made of Au, Ag, Cu, solder or the like, and it can be formed by, for example, stud bumping, printing, mask deposition, plating, and transfer. The bumps 12a and the substrate 10 can be connected by a method of using heat-melted solder bumps, using a conductive paste applied to the bumps 12a for adhesion, pressing the bumps 12a onto the substrate 10 through curing and shrinking of the first adhesive layer 11, applying ultrasonic waves, or thermo-compression. Any suitable method can be selected, based on the material of the bumps 12a.

The wires 15 typically are made of Au or Al and so on, and they serve to connect electrically the electrode pads 14a of the second semiconductor chip 14 and the electrode pads 10a on the substrate 10. The connection is provided mainly by a thermo-compression bonding with the use of ultrasonic waves.

In many cases, the molded resin 16 is made of a thermo-setting resin based on an epoxy resin or the like, to which an additive such as a curing agent, a filler, a curing accelerator, a coupling agent and a flame retardant is added in accordance with the desired characteristics. The molded resin 16 in an uncured state can be a solid or a liquid in accordance with the formation method. In forming the molded resin 16, transferring can be used for a solid resin, while potting and/or printing can be used for a liquid resin.

As shown in FIGS. 1A and 1B, in the stacked chip semiconductor device according to the first embodiment, the fringe of the first adhesive layer 11 spreads out of the periphery of the first semiconductor chip 12 so as to form a fillet 11a. A specific side of the filler 11a is formed larger than at any of the three remaining sides, since an adhesive to be the first adhesive layer 11 is injected from this side as mentioned above. In this embodiment, the first semiconductor chip 12 is packaged so that its central axis B is offset with respect to the central axis A of the substrate 10 on a side opposite to the side at which a large fillet 11a is formed. Thereby, the area of the substrate 10 can be reduced in comparison with a case of a conventional technique where the first semiconductor chip 12 is disposed at the center of the substrate 10. Therefore, the semiconductor device can be miniaturized as a whole.

Furthermore, since the second semiconductor chip 14 is disposed so that its central axis C coincides with the central axis A of the substrate 10, the length and the loop shape of the wires 15 formed around the second semiconductor chip 14 can be made uniform, while the conventional technique requires that the wire 15 bridging over the largest fillet 11a be longer than the wires 15 at the three remaining sides. According to this embodiment, there is no modification in the equipment, and thus the working time is shortened and the quality is equalized, resulting in improvement in the mass-productivity.

An example of specific dimensions is as follows: the length of the fillet 11a, which is formed with an adhesive composing the first adhesive layer 11, may be about 2 mm from the periphery of the first semiconductor chip 12 at the adhesive injection side, and about 0.5 mm at the three remaining sides. Therefore, according to this embodiment, the area of the substrate 10 can be reduced by the product of 1.5 mm of the difference and the side length of the fillet along the periphery of the first semiconductor chip 12.

Similarly, regarding the wires 15, the difference in the wire length can be eliminated substantially in this embodiment, equalizing the length of the wires at the four sides of the second semiconductor chip 14, while the length of the wires formed above the adhesive injection side should be differentiated by about 1.5 mm from the wire length at any of the three sides in the conventional technique.

In the semiconductor device as shown in FIG. 1B, the substrate 10, the first semiconductor chip 12 and the second semiconductor chip 14 are squares when viewed from above. Even when they are oblong, reduction of the area of the substrate 10 and equalization in length of the wires 15 can be achieved by offsetting the central axis B of the first semiconductor chip 12 from the central axis A of the substrate 10, and by positioning the central axis A of the substrate 10 and the central axis C of the second semiconductor chip 14 so as to coincide with each other. Thereby, miniaturization of the semiconductor device and improvement in the mass-production can be achieved.

Without being limited to the case as shown in FIG. 1B where the wires 15 are formed at all of the four sides of the periphery of the second semiconductor chip 14, the area of the substrate 10 can be reduced to miniaturize the semiconductor device by offsetting the central axis B of the first semiconductor chip 12 from the central axis A of the substrate 10 in accordance with the concept of this embodiment. In such a case, when the wires 15 are to be formed above the side with the largest fillet 11a among the four sides, by positioning the central axis A of the substrate 10 so as to coincide with the central axis C of the second semiconductor chip 14, the length of the wires 15 can be equalized in comparison with the conventional technique, thus improving the mass-productivity of the semiconductor device.

In FIGS. 1A and 1B, the fillet 11a is the largest at the side of the periphery of the first semiconductor chip 12 from which the adhesive for composing the first adhesive layer 11 is injected. The concept of this embodiment is applicable, for example, even when fillets 11a formed at two adjacent sides are larger than the fillets 11a at the two remaining sides. In that case, the area of the substrate 10 can be reduced by disposing the first semiconductor chip 12 on the substrate 10 with an offset toward a side opposite to the respective sides with the large fillets 11a, i.e., toward two sides with small fillets along the diagonal of the first semiconductor chip 12.

In the above description, a liquid resin is used for an adhesive composing the first adhesive layer 11. However, the fillet 11a may be enlarged similarly at a specific side even when the first adhesive layer 11 is a film. More particularly, it may occur when the positions and number of the bumps 12a of the first semiconductor chip 12 are nonuniform at the four sides. The area of the substrate 10 can be reduced to miniaturize the semiconductor device even in this case, by mounting the first semiconductor chip 12 on the substrate 10 while being offset toward a side opposite to a side having the largest fillet 11a.

(Second Embodiment)

FIGS. 2A–2E are cross-sectional views showing, in this order, a process of manufacturing a semiconductor device according to a second embodiment.

Figure 2A:
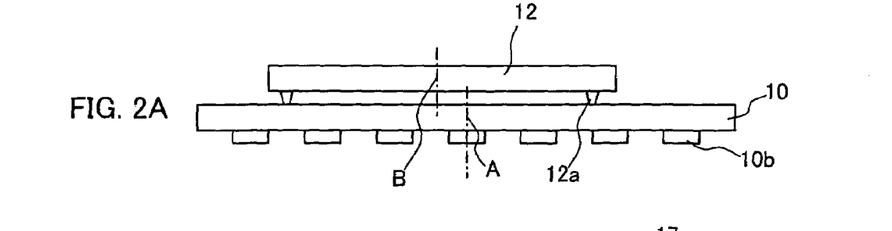
FIGS. 2A–2E are cross-sectional views to show a process in manufacturing a stacked chip semiconductor device according to a second embodiment of the present invention.

First, as shown in FIG. 2A, a flip-chip bonding step is carried out. In this step, a first semiconductor chip 12 is mounted on an upper face of a substrate 10 having electrode pads. Here, the first semiconductor chip 12 is disposed with its central axis B being offset from a central axis A of the substrate 10. Bumps 12a are provided on the electrode pads (not shown) of the first semiconductor chip 12, and the first semiconductor chip 12 is positioned so that the bumps 12a are connected to the electrode pads of the substrate 10. That is, in the design, the electrode pads to be connected to the first semiconductor chip 12 provided on the upper face of the substrate 10 are disposed with an offset from the central axis A of the substrate 10, and the offset is equal to the offset between the central axis A of the substrate 10 and the central axis B of the first semiconductor chip 12. The bumps 12a can be provided with a conductive paste for being connected to the electrode pads of the substrate 10. The offset direction will be described below by referring to the subsequent underfilling step.

Figure 2B:
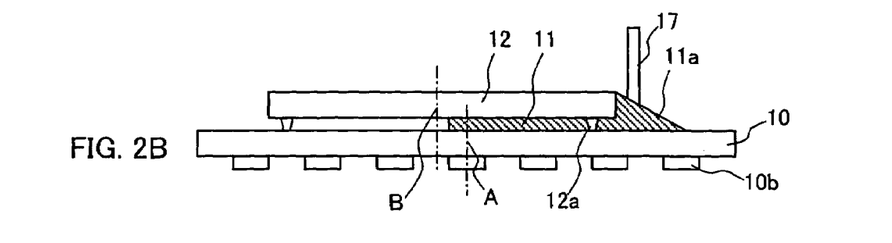

Next, as shown in FIG. 2B, an underfilling step is carried out. In this step, a liquid adhesive is injected into a gap between the substrate 10 and the first semiconductor chip 12, thus forming a first adhesive layer 11. The first adhesive layer 11 has a fringe spreading out of the first semiconductor chip 12 so as to form a fillet 11a. The adhesive is injected by using a dispenser. That is, a dispensing nozzle 17 is positioned at one side of the periphery of the first semiconductor chip 12 in order to discharge a liquid adhesive. As required, the dispensing nozzle 17 discharges the adhesive while reciprocating along the adhesive injection side of the first semiconductor chip 12, so that a pool of the adhesive of an amount required for the injection is formed. The adhesive in the pool is charged into the gap between the first semiconductor chip 12 and the substrate 10 due to its own surface tension. Here, when the substrate 10 is inclined as a whole so that the adhesive flows downwards, the self-weight of the adhesive works in a direction for charging the adhesive. This is preferred since the charging speed is increased in comparison with a case of placing the substrate 10 horizontally. After completing the charge of the adhesive, the injected adhesive is cured by heat so as to form a first adhesive layer 11.

A specific description of the fillet 11a of the first adhesive layer 11 follows. In an example where the adhesive is injected from a side of the periphery of the first semiconductor chip 12, the adhesive makes a pool around the side. Therefore, a fillet 11a formed at the side after curing the adhesive will be longer and higher as compared to the fillet 11a at the other sides. At the three sides, since the fillets 11a will be formed naturally due to the surface tension of the adhesive and flow at the time of thermosetting, the fillets 11a will not grow so much as the fillet 11a at the pool. More specifically, the maximum length of the fillet 11a protruding from the side with the pool is about 2 mm in general, and the length of the fillet 11a protruding from the three other sides is about 0.5 mm. As mentioned above, the length of the fillet 11a of the first adhesive layer 11 protruding out from the periphery of the first semiconductor chip 12 will be greater at one side having a pool to which the adhesive is injected than at any of the three other sides. In addition, the fringe at that side becomes higher at the periphery of the first semiconductor chip 12. The shape of the fillet 11a at the pool can be controlled by optimizing conditions such as the material of the adhesive, the amount and time for injection and the curing temperature.

In light of the above-mentioned situations, the central axis B of the first semiconductor chip 12 with respect to the central axis A of the substrate 10 is offset toward a side opposite to a side having the largest fillet 11a.

Figure 2C:
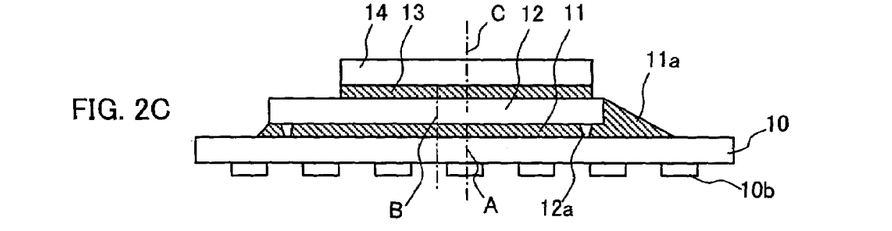

Next, a stack-die-bonding step is carried out as shown in FIG. 2C. In this step, a second semiconductor chip 14 having electrode pads on the periphery of its upper face is mounted on the upper face of the first semiconductor chip 12 via a second adhesive layer 13. At this time, it is preferable that the central axis C of the second semiconductor chip 14 coincides with the central axis A of the substrate 10 so that the length of the wires to be formed in the subsequent wire-bonding step can be equalized at the four sides of the periphery of the second semiconductor chip 14.

Similar to the first adhesive layer 11, the adhesive composing the second adhesive layer 13 can be a thermosetting resin based on an epoxy resin or the like. The adhesive in an uncured state can be a liquid or a film, and the type of the adhesive can be selected depending on the required characteristics or processes. A representative process for using a film-like adhesive includes sticking the adhesive to a back face of the second semiconductor chips 14 in a wafer state, cutting out the film-like adhesive in the same size as each second semiconductor chip 14 at a time of separating into the individual second semiconductor chips 14, and thermo-compressing the adhesive onto the upper face of the first semiconductor chip 13. An alternative method for using a film-like adhesive includes cutting out the film-like adhesive in a rolled state for obtaining an appropriate area, thermocompressing onto the upper face of the first semiconductor chip 13, and subsequently, pressing the second semiconductor chip 14 on the adhesive. A method for using a liquid adhesive includes dropping the liquid adhesive on the upper face of the first semiconductor chip 12 at normal temperature, mounting the second semiconductor chip 14 on the adhesive and subsequently introducing into a curing furnace in-line or in a batch so as to cure the adhesive by heat.

Figure 2D:
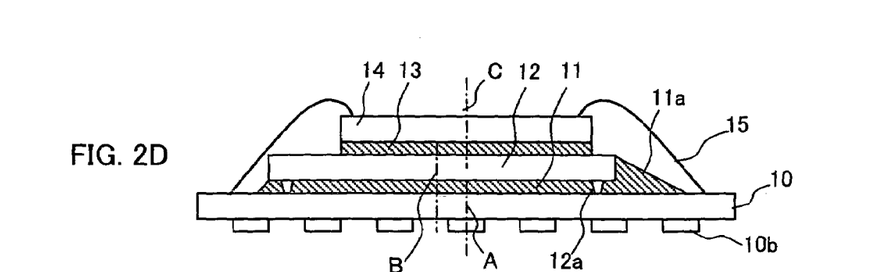

Next, a wire-bonding step is carried out as shown in FIG. 2D. In this step, the electrode pads of the substrate 10 and the electrode pads of the second semiconductor chip 14 are connected by wires 15. If the second semiconductor chip 14 is disposed with its central axis C coincides with the central axis A of the substrate in the previous step of stack-die bonding, the wire length can be equalized over the entire periphery of the second semiconductor chip 14, thereby the equipment for wiring can be uniform at all the four sides so as to shorten the process time and improve the yield.

Figure 2E:
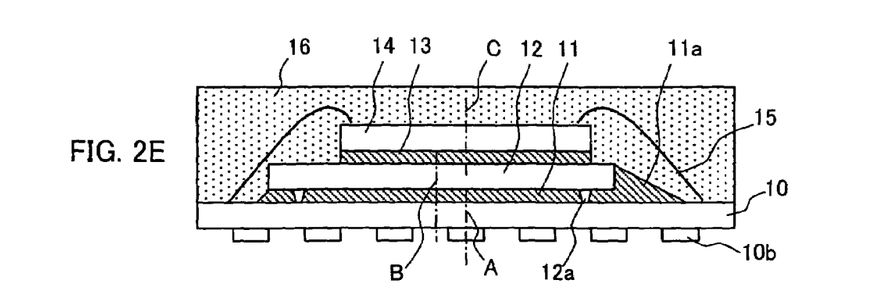

Finally, an encapsulating step is carried out as shown in FIG. 2E. In this step, the first semiconductor chip 12, the second semiconductor chip 14 and the wires 15 are encapsulated with a molded resin 16, thereby forming an outline of a semiconductor device. Typically, the molded resin 16 is a thermosetting resin based on an epoxy resin or the like, to which an additive such as a curing agent, a filler, a curing accelerator, a coupling agent and a flame retardant is added in accordance with desired characteristics. The molded resin in an uncured state can be a solid or a liquid in accordance with the formation method. In forming the molded resin 16, transferring can be applied for a solid resin, and potting and/or printing can be applied for a liquid resin. A transfer method includes melting a tablet-like resin 16 in a mold die, and compressing the resin so as to inject into a space retaining an object in the mold die and encapsulating. Thus the resin is cured by heat. Since curing in the mold die can be insufficient, in many cases the resin is later introduced into a curing furnace so as to cure completely the molded resin 16. In a potting method, the resin 16 is coated on the object and cured later in a curing furnace so as to form an encapsulated body. A printing method include sticking a screen mask to an object, transferring the resin to an opening of the screen mask with a printing squeegee, separating the screen mask and then treating in a curing furnace so as to form an encapsulated body. The printing process is carried out in a vacuum chamber effectively for preventing voids, since aeration can be suppressed.

In FIGS. 2A–2E, the fillet 11a is the largest at one side of the periphery of the first semiconductor chip 12 to which the adhesive for composing the first adhesive layer 11 is injected. A similar effect can be achieved by applying the manufacturing method according to this embodiment even for a case, e.g., where the fillets 11a is larger at two adjacent sides than at the two remaining sides. In such a case, the first semiconductor chip 12 is disposed on the substrate 10 while being offset toward the sides respectively opposing the sides with larger fillets 11a, i.e., toward the two sides with smaller fillets 11a along the diagonal of the first semiconductor chip 12, so that the area of the substrate 10 can be reduced so as to miniaturize the semiconductor device.

The above description refers to a case for using a liquid resin for the adhesive composing the first adhesive layer 11. Even if the first adhesive layer 11 is a film, the fillet may be enlarged at a specific side, especially when the positions and number of the bumps 12a of the first semiconductor chip 12 are not uniform at the four sides of the first semiconductor chip 12. Even in this case, by mounting the first semiconductor chip 12 on the substrate 10 with an offset toward a side opposite to a side having the largest fillet 11a, the area of the substrate 10 can be reduced so as to miniaturize the semiconductor device.

(Third Embodiment)

FIGS. 3A–3E are cross-sectional views showing, in this order, a process for manufacturing a semiconductor device according to a third embodiment.

Figure 3A:
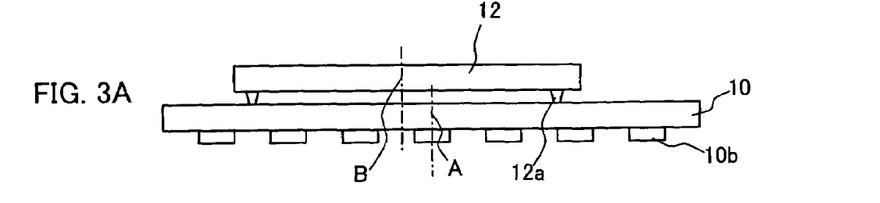
FIGS. 3A–3E are cross-sectional views to show a process in manufacturing a stacked chip semiconductor device according to a third embodiment of the present invention.

First, as shown in FIG. 3A, a flip-chip bonding step is carried out. In this step, a first semiconductor chip 12 having bumps 12a is flip-chip-bonded to an upper face of a substrate 10 having electrode pads. Here, the first semiconductor chip 12 is disposed with its central axis B being offset from a central axis A of the substrate 10. The bumps 12a can be applied with a conductive paste for connecting to the electrode pads of the substrate 10. The offset is provided toward a side opposite to a side at which the largest fillet 11a is to be formed in a subsequent underfilling step.

Figure 3B:
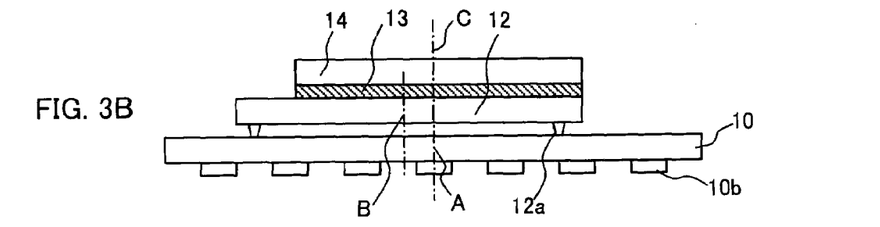

Next, as shown in FIG. 3B, a stack-die-bonding step is carried out. In this step, a second semiconductor chip 14 having electrode pads on the periphery of its upper face is mounted on the upper face of the first semiconductor chip 12 via a second adhesive layer 13. Similar to the first adhesive layer 11, an adhesive composing the second adhesive layer 13 can be made of a thermosetting resin based on an epoxy resin or the like. The resin in an uncured state can be a liquid or a film, and the type of the resin can be selected in accordance with the required characteristics and the processes.

Figure 3C:
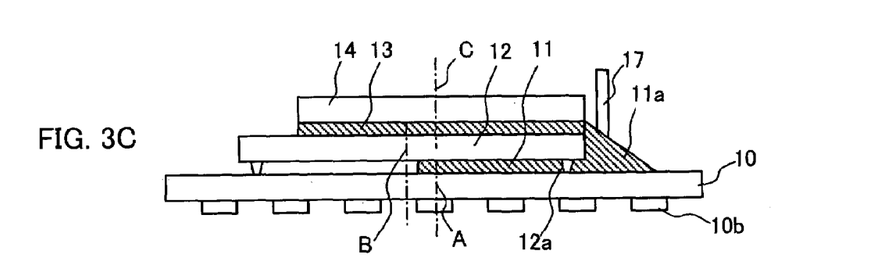

Next, as shown in FIG. 3C, an underfilling step is carried out. In this step, a liquid adhesive is injected into a gap between the substrate 10 and the first semiconductor chip 12 so as to form a first adhesive layer 11. The first adhesive layer 11 protrudes out of the periphery of the first semiconductor chip 12 so as to form a fillet 11a. The resin is injected by a dispenser. More specifically, a dispensing nozzle 17 is positioned at the periphery of the first semiconductor chip 12 so as to discharge a liquid adhesive.

This step will be described more in detail below. A typical disadvantage of this step is that the liquid adhesive is cured in a state of spreading onto the upper face of the first semiconductor chip 12. In the second embodiment, the adhesive spreading onto the upper face of the first semiconductor chip 12 may inhibit adhesion of the second adhesive layer 13 at the time of stack-die-bonding the second semiconductor chip 14 to the upper face of the first semiconductor chip 12, resulting in insufficient strength for adhesion between the first semiconductor chip 12 and the second semiconductor chip 14. Furthermore, this adhesive spreading onto the upper face of the first semiconductor chip 12 may cause a gap between the first semiconductor chip 12 and the second semiconductor chip 14 in the stack-die-bonding of FIG. 2C. This gap can absorb water in the air after being encapsulated with a molded resin 16, and thus may degrade the reliability such as a reflow heat resistance of the semiconductor device. Such an adhesive spreading onto the upper face of the first semiconductor chip 12 will occur more frequently when the thickness of the first semiconductor chip 12 is decreased.

However, according to this embodiment, a stack-die-bonding step of FIG. 3B is carried out before the underfilling step of FIG. 3C. Therefore, the spread adhesive of the first adhesive layer 11 cannot be present between the second adhesive layer 13 and the upper face of the first semiconductor chip 12, thus eliminating the problems such as insufficient adhesion strength between the first semiconductor chip 12 and the second semiconductor chip 14 and/or the gap between the first semiconductor chip 12 and the second adhesive layer 13. As a result, the yield in the mass-production and also the reliability as a semiconductor device can be improved.

In the stack-die-bonding step as shown in FIG. 3B, it is preferable that the second semiconductor chip 14 is disposed so that one side of the periphery is positioned flush with a side of the periphery of the first semiconductor chip 12 to which the adhesive is injected in the underfilling step shown in FIG. 3C. In this condition, during the underfilling step, the adhesive can be pooled excessively by the thickness of the second adhesive layer 13 and the second semiconductor chip 14 in addition to the thickness of the first semiconductor chip 12, at the adhesive pool formed in the vicinity of the adhesive injection side of the first semiconductor chip 12. This will prevent the adhesive from spreading onto the upper face of the first semiconductor chip 12, and contribute to improved reliability of the semiconductor device. The effect of preventing the adhesive from spreading onto the upper face of the first semiconductor chip 12 is particularly remarkable for a case where the thickness of the first semiconductor chip 12 is decreased.

Figure 3D:
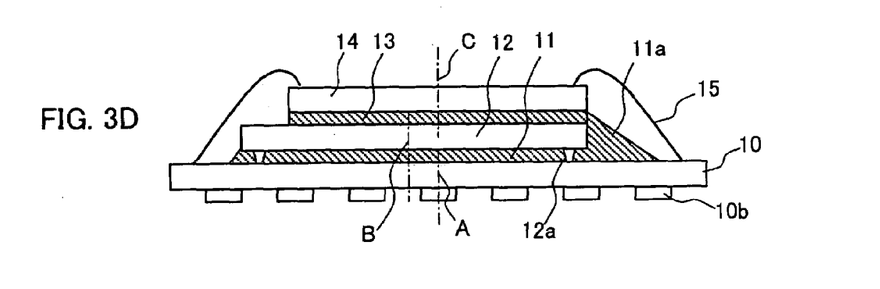

Next, as shown in FIG. 3D, a wire-bonding step is carried out. In this step, the electrode pads of the substrate 10 and the electrode pads of the second semiconductor chip 14 are connected by wires 15.

Figure 3E:
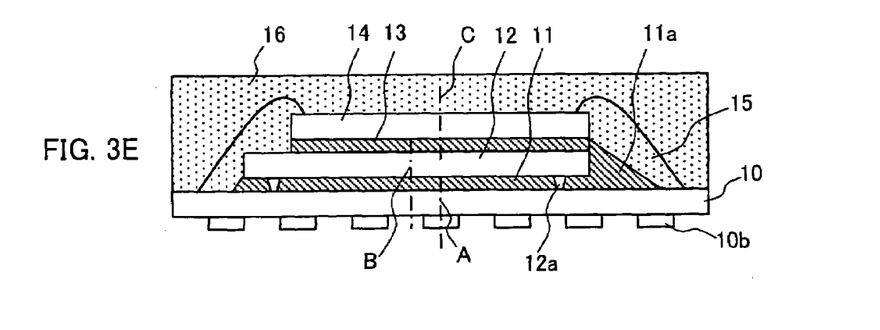

Finally, as shown in FIG. 3E, an encapsulating step is carried out. In this step, the first semiconductor chip 12, the second semiconductor chip 14 and the wires 15 are encapsulated with a molded resin 16, thereby forming an outline of a semiconductor device.

As mentioned above, according to this embodiment where the first semiconductor chip 12 is disposed while being offset from the central axis A of the substrate 10, the area of the substrate 10 can be reduced and the semiconductor device can be miniaturized. Furthermore, by preventing the first adhesive layer 11 spreading onto the upper face of the first semiconductor chip 12 from inhibiting adhesion between the first semiconductor chip 12 and the second semiconductor chip 14, the adhesion of the second semiconductor chip 14 to the first semiconductor chip 12 can be improved, and this serves to improve the reliability of a semiconductor device.

(Fourth Embodiment)

Figure 4:
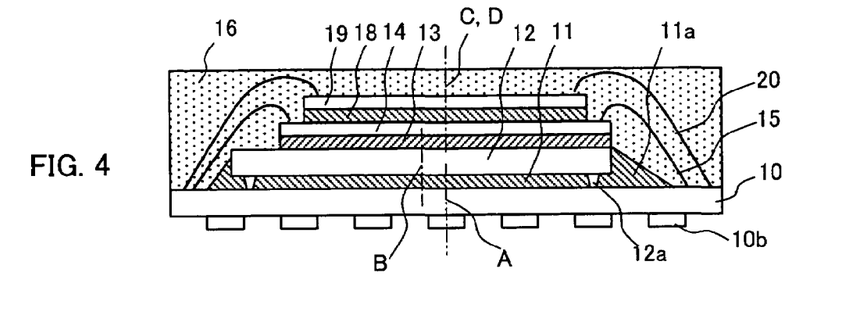
FIG. 4 is a cross-sectional view to show a stacked chip semiconductor device according to a fourth embodiment of the present invention.

FIG. 4 is a cross-sectional view to show a stacked chip semiconductor device according to a fourth embodiment.

In this semiconductor device, a first semiconductor chip 12 having bumps 12a is mounted via a first adhesive layer 11 on a substrate 10 having electrode pads (not shown) on its upper face and a land 10b on its bottom face. The first semiconductor chip 12 is disposed with its central axis B being offset from the central axis A of the substrate 10. The offset is provided so that the first semiconductor chip 12 is shifted toward the largest fillet 11a as a part of the first adhesive layer 11 protruding out of the first semiconductor chip 12.

On the upper face of the first semiconductor chip 12, a second semiconductor chip 14 having electrode pads (not shown) on the periphery of its upper face is mounted via a second adhesive layer 13. The electrode pads of the second semiconductor chip 14 and the electrode pads of the substrate 10 are connected electrically via wires 15. Here, the central axis C of the second semiconductor chip 14 coincides substantially with the central axis A of the substrate 10. On the upper face of the second semiconductor chip 14, a third semiconductor chip 19 having electrode pads (not shown) on the periphery of its upper face is mounted via a third adhesive layer 18, and the electrode pads of the third semiconductor chip 19 and the substrate 10 are electrically connected via wires 20. Here, the third semiconductor chip 19 is disposed with its central axis D substantially coinciding with the central axis A of the substrate 10 and to the central axis C of the second semiconductor chip 14. The first semiconductor chip 12, the second semiconductor chip 14, the third semiconductor chip 19, the wires 15 and 20 are encapsulated with a molded resin 16, and thereby a semiconductor device having three-layered semiconductor chips is formed.

According to this embodiment, by disposing the first semiconductor chip 12 while being offset from the central axis A of the substrate 10, the area of the substrate 10 can be reduced and the semiconductor device can be miniaturized. Moreover, since the central axis C of the second semiconductor chip 14 and the central axis D of the third semiconductor chip 19 coincide substantially with the central axis A of the substrate 10, the wires 15 and 20 can be formed in uniform length over the entire semiconductor chips, and this contributes to shortened work time and improved quality.

In the embodiment as shown in FIG. 4, the third semiconductor chip 19 is electrically connected to the substrate 10 via the wires 20. Also, miniaturization of the semiconductor device and improvement in the mass-productivity can be obtained even when the third semiconductor chip 19 is electrically connected by wires to the second semiconductor chip 14, or when the third semiconductor chip 19 is flip-chip-bonded to the second semiconductor chip 14 via bumps.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, all changes that come within the meaning and range of equivalency of the claims are intended to be embraced therein.

What is claimed is:

1. A stacked chip semiconductor device comprising: a substrate having electrode pads; a first semiconductor chip that is flip-chip-packaged on the substrate via a first adhesive layer; a second semiconductor chip that is mounted on an upper part of the first semiconductor chip and that has electrode pads; wires for electrically connecting the electrode pads of the second semiconductor chip and the electrode pads of the substrate; and a molded resin for encapsulating the first semiconductor chip, the second semiconductor chip and the wires, the first adhesive layer forming a fillet at the periphery of the first semiconductor chip, wherein
the first semiconductor chip is disposed with its central axis being offset from a central axis of the substrate, the offset being provided so that the first semiconductor chip is shifted toward a side opposite to a side where the fillet has a maximum length from the periphery of the first semiconductor chip.

2. The stacked chip semiconductor device according to claim 1, wherein the second semiconductor chip is mounted substantially at the center of the substrate.

* * * * *